United States Patent
Yang et al.

(10) Patent No.: US 11,784,385 B2
(45) Date of Patent: Oct. 10, 2023

(54) WILKINSON POWER COMBINER, COMMUNICATION UNIT AND METHOD THEREFOR

(71) Applicant: NXP B.V., Eindhoven (NL)

(72) Inventors: Xin Yang, Houten (NL); Mark Pieter van der Heijden, Eindhoven (NL)

(73) Assignee: NXP B.V., Eindhoven (NL)

( * ) Notice: Subject to any disclaimer, the term of this patent is extended or adjusted under 35 U.S.C. 154(b) by 195 days.

(21) Appl. No.: 17/358,072

(22) Filed: Jun. 25, 2021

(65) Prior Publication Data
US 2022/0006171 A1    Jan. 6, 2022

(30) Foreign Application Priority Data
Jul. 3, 2020    (EP) .................................... 20184083

(51) Int. Cl.
| H01P 5/16 | (2006.01) |
| H03H 7/06 | (2006.01) |
| H03H 7/09 | (2006.01) |
| H01P 1/365 | (2006.01) |

(52) U.S. Cl.
CPC ................ *H01P 5/16* (2013.01); *H01P 1/365* (2013.01); *H03H 7/06* (2013.01); *H03H 7/09* (2013.01)

(58) Field of Classification Search
CPC .............. H01P 5/16; H03H 7/06; H03H 7/09
USPC .......................................... 333/125–130, 172
See application file for complete search history.

(56) References Cited

U.S. PATENT DOCUMENTS

| 5,045,821 A | 9/1991 | Staudinger et al. |
| 10,250,204 B2* | 4/2019 | Tanimoto ................ H03F 3/602 |
| 2007/0129104 A1 | 6/2007 | Sano et al. |
| 2010/0244981 A1 | 9/2010 | Gorbachov |
| 2011/0032854 A1 | 2/2011 | Carney |
| 2016/0352289 A1 | 12/2016 | Kim |
| 2017/0047904 A1 | 2/2017 | Szopko |
| 2017/0077892 A1 | 3/2017 | Thorup |
| 2018/0131453 A1 | 5/2018 | Sharma et al. |
| 2018/0287566 A1 | 10/2018 | Komatsuzaki et al. |
| 2019/0214700 A1 | 7/2019 | Wang et al. |
| 2020/0169230 A1 | 5/2020 | Gruner et al. |
| 2020/0274575 A1 | 8/2020 | Yang et al. |

FOREIGN PATENT DOCUMENTS

| EP | 2975688 A1 | 1/2016 |
| WO | 2015176077 A2 | 11/2015 |

OTHER PUBLICATIONS

Gupta, R.K., "Quasi-Lumped-Element 3- and 4-Port Networks for MIC and MMIC Applications", IEEE MTT-S International Microwave Symposium Digest, pp. 409-411, May 30-Jun. 1, 1984.
(Continued)

*Primary Examiner* — Rakesh B Patel

(57) ABSTRACT

A Wilkinson power combiner (202) is described that includes: at least one input port (210) coupled to at least one output port (212, 214, 216, 218) by at least two power combining stages. A first power combining stage (204) of the at least two power combining stages is configured as a single-stage first frequency pass circuit and a second power combining stage (206) of the at least two stages is configured as a single-stage second frequency pass circuit, and wherein the first frequency is different to the second frequency.

11 Claims, 9 Drawing Sheets

(56) References Cited

OTHER PUBLICATIONS

Kawai, T., "Design Method of Lumped-Element Dual-Band Wilkinson Power Dividers Based on Frequency Transformation", Proceedings of Asia-Pacific Microwave Conference, pp. 710-713, Dec. 2010.
Lee, S., "A 15-55 GHz Low-Loss Ultra-Compact Folded Inductor-Based Multi-Section Wilkinson Power Divider for Multi-Band 5G Applications", IEEE MTT-S International Microwave Symposium (IMS), pp. 432-435, Jun. 2-7, 2019.
Love, M., "Lumped-Element Wilkinson Power Combiners Using Reactively Compensated Star/Delta Coupled Coils in 28-nm Bulk CMOS", IEEE Transactions on Microwave Theory and Techniques, pp. 1798-1811, vol. 67, No. 5, May 2019.
U.S. Appl. No. 17/358,080, filed Jun. 25, 2021, entitled "Wilkinson Power Combiner, Communication Unit and Method Therefor."
Non Final Office Action; U.S. Appl. No. 17/358,080; 8 pages dated Nov. 22, 2022.
Notice of Allowance; U.S. Appl. No. 17/358,080; 6 pages dated Mar. 7, 2023.

\* cited by examiner

FIG. 1 –
Prior Art

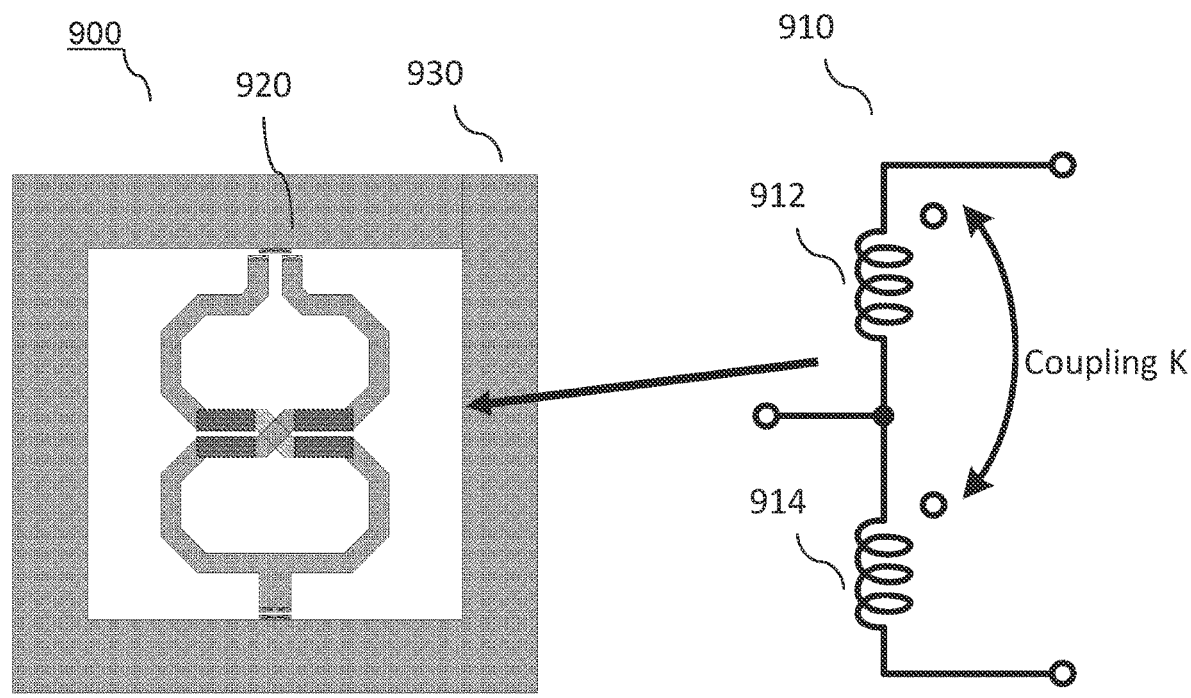
FIG. 9
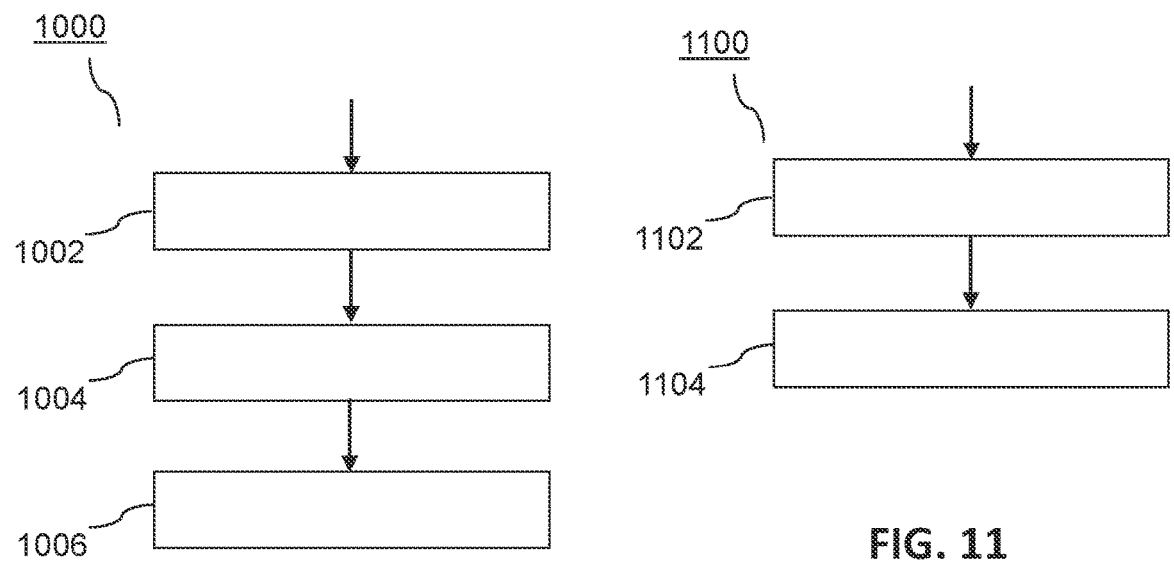
FIG. 10
FIG. 11

WILKINSON POWER COMBINER, COMMUNICATION UNIT AND METHOD THEREFOR

CROSS-REFERENCE TO RELATED APPLICATIONS

This application claims the priority under 35 U.S.C. § 119 of European Patent application no. 20184083.2, filed on Jul. 3, 2020, and entitled WILKINSON POWER COMBINER, COMMUNICATION UNIT AND METHOD THEREFOR, the contents of which are incorporated by reference herein.

FIELD OF THE INVENTION

The field of the invention relates to a Wilkinson power combiner/splitter, a communication unit having a Wilkinson power combiner and a method therefor. The invention is applicable to, but not limited to, a radio frequency Wilkinson power combining circuit.

BACKGROUND OF THE INVENTION

In the field of radio frequency (RF) and microwave engineering, the Wilkinson power divider is a specific class of power divider circuit that can achieve isolation between the output ports, whilst maintaining a matched condition on all ports. The Wilkinson power divider splits an input signal into two equal phase output signals or combines two equal-phase signals into one signal in the opposite direction. Thus, it is often referred to as either a Wilkinson power divider (or splitter) or a Wilkinson power combiner. Hereafter, the term Wilkinson power combiner will be used to encompass both applications.

The Wilkinson power combiner is particularly simple and can easily be realised using printed components on a printed circuit board that utilises quarter wave ($\lambda/4$) transmission lines (TLs) to effect the power combination or power split, e.g. these designs use quarter wavelength transformers to split an input signal and to provide two output signals that are 'in-phase' with each other, with a characteristic impedance $Z_c = \sqrt{2}Z_0$. This implementation at lower frequencies can be bulky in size due to the $\lambda/4$ TLs. This often means that the Wilkinson Power Combiner tends to be used more at higher, e.g. high microwave, frequencies where the $\lambda/4$ transmission line lengths become manageable.

It is also possible to use lumped inductor and capacitor elements to implement a Wilkinson power combiner. However, it is known that use of lumped inductor and capacitor elements complicates the overall circuit design. Use of lumped element components also makes the accurate phase matching of output ports more difficult, due to different component tolerances of parallel circuits. FIG. 1 illustrates one typical application of a Wilkinson power combiner 100 that that uses lumped inductor and capacitor elements. Here, multiple Wilkinson power combiners 120, 122, 124 are employed in a multi-channel analog beamforming integrated circuit (IC), e.g. for antenna arrays. The multi-channel analog beamforming integrated circuit includes an input 110 having a shunt inductance that is an electro-static discharge (ESD) coil, which is usually placed at the input of the complete chain a transmitter sense), such as the input pin of the IC. The input 110 is provided to a first power combiner (or splitter in a transmitter sense) 120 that provides two equal phase representations of the input signal to a second Wilkinson power combiner 122 and third Wilkinson power combiner 124. Each of the second Wilkinson power combiner 124 also produces two equal phase representations of their respective input signal. The outputs of the second Wilkinson power combiner 122 and third Wilkinson power combiner 124 are input to a respective antenna in the antenna array 138 via a respective beamformer 130, 132, 134, 136 where control of a respective phase shifter controls a phase of that particular output signal.

In a receive sense, a receive signal is extracted from the antenna array 138 and input to respective beamformers 130, 132, 134, 136 and then signals are combined in the second Wilkinson power combiners 122 and third Wilkinson power combiner 124. The outputs of the second Wilkinson power combiners 122 and third Wilkinson power combiner 124 are then input to the first power combiner 120 to combine all phase adjusted (beam formed) signals and provide these to the receiver circuitry (not shown).

FIG. 1 also illustrates a classical lumped element approach of one such Wilkinson power combiner 124, which uses a shunt capacitor-series inductor-shunt capacitor (CLC) low pass u network structure for the two combining/splitting paths. The Wilkinson power combiner 124 includes, on one side, a single port P1 140 with a matched impedance $Z_0$, and, on the other side, two ports P2 142, P3 144, each also with a matched impedance Zo. With a lumped element Wilkinson combiner approach, the transmission lines are replaced by a CLC low-pass design, as shown, Here, the low pass $\pi$ network comprises shunt capacitors Co 154, 164 separated by a lumped element inductor/coil $L_0$ 152, 162. An isolation resistance $R_{iso}$ 170 separates (and isolates) receive or transmit signals on the two Wilkinson combiner paths (sometimes referred to as 'arms'). The device parameters are:

$$L_0 = \frac{\sqrt{2}\, Z_0}{\omega}$$

$$C_0 = \frac{1}{\omega \sqrt{2}\, Z_0}$$

$$R_{iso} = 2Z_0$$

[1]

However, the Wilkinson power combiner is often laced with a delicate design choice in either implementing the circuit with quarter wave ($\lambda/4$) transmission lines, where the quarter wave ($\lambda/4$) transmission lines become unmanageable at low microwave frequencies or high radio frequencies (e.g. <5 GHz). However, at these lower microwave frequencies, the two series separated coils $L_0$ 152, 162 in a lumped element Wilkinson power combiner result in a relatively large chip size, which is also undesirable. Typical applications for fifth generation (5G) mmWave networks cover frequency ranges from 24-50 GHz. A major problem at higher frequencies is that die size needs to be small for cost as well as physical-size reasons. Hence, for a practical RF design, it is important to populate multiple of these beamformer chips on an antenna panel, comprising up to 256 or more patches. In order to route all of the RF signal tracks in between these chips, sufficient die space is needed. Hence, an improved design is needed to assist the designer of Wilkinson power combiners radio frequency and microwave frequencies.

The paper titled "Lumped Element Wilkinson Power Combiners Using Reactively Compensated Star/Delta Coupled Coils in 28-nm Bulk CMOS", authored by Matthew Love et. al, and published in May 2019 in the IEEE Transactions on Microwave Theory and Techniques, pp, 1798-1811, Vol. 67, No. 5 describes a 5 GHz low-pass Wilkinson combiner with port-to-port isolation capacitor and coupled (differential/parallel) inductors.

SUMMARY OF THE INVENTION

The present invention provides a Wilkinson power combiner circuit, a communication unit, and a method therefor, as described in the accompanying claims. Specific embodiments of the invention are set forth in the dependent claims. These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 9 illustrates one example of a layout showing a Figure-8 design and one example of an associated circuit that may benefit from a Figure-8 design, according to example embodiments of the invention.

FIG. 10 illustrates one example of a flowchart of a method of power combining/splitting using (at least) a 2-stage power RF Wilkinson combiner/splitter, for example using a HP-LP arrangement, according to example embodiments of the invention.

FIG. 11 illustrates one example of a flowchart of a method of power combining of a RF Wilkinson combiner/splitter, using a high-pass (or band-pass) frequency circuit, according to example embodiments of the invention.

DETAILED DESCRIPTION

Figure 1:
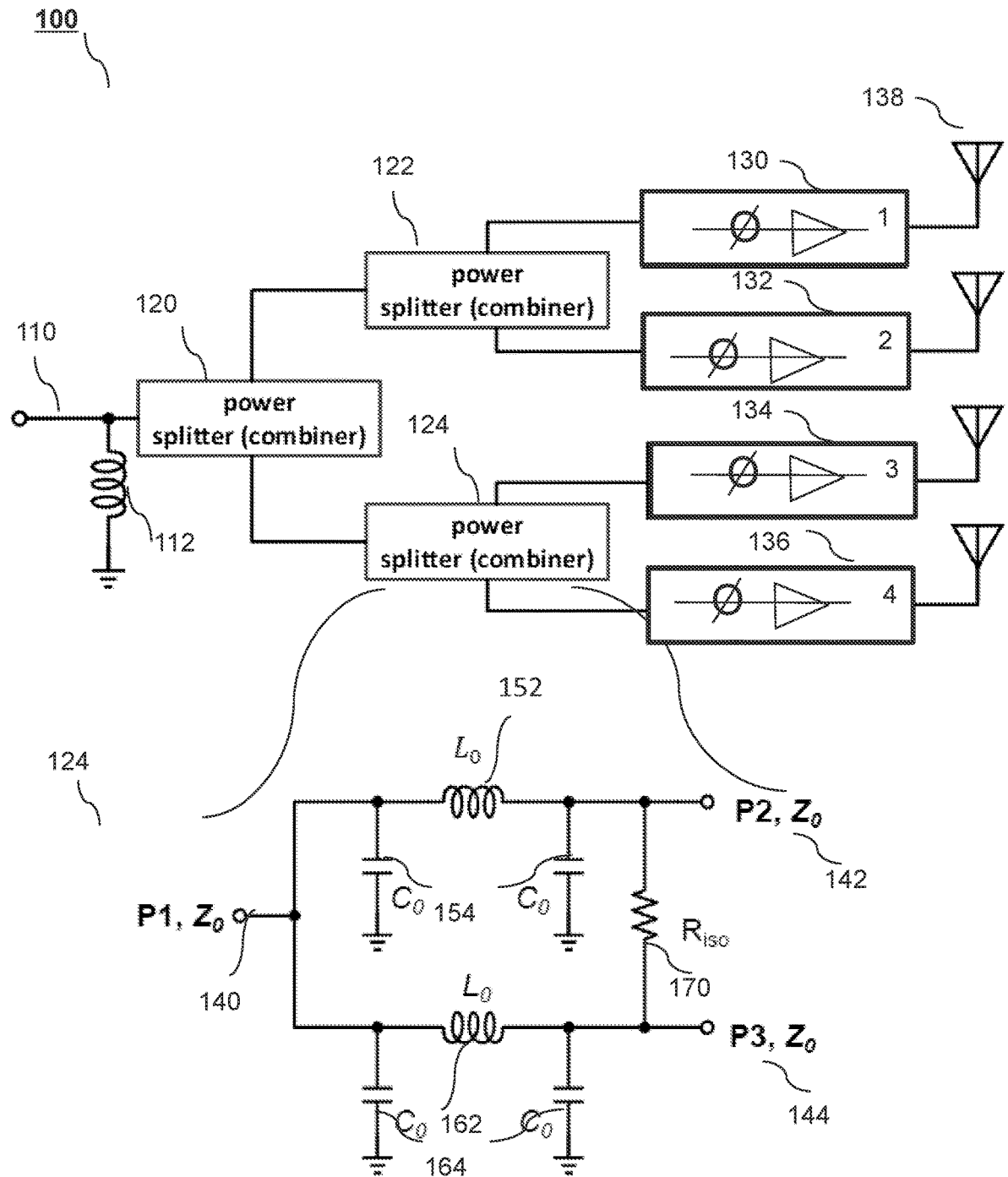
FIG. 1 illustrates a simplified known drawing of a radio frequency (RF) Wilkinson combiner with a classical CLC low pass structure in a multi-beamforming application.

In a first aspect of the invention, examples of the present invention provide a Wilkinson power combiner that includes at least one input port coupled to at least one output port by at least two power combining stages. A first power combining stage of the at least two power combining stages is configured as a single-stage first frequency pass circuit and a second power combining stage of the at least two stages is configured as a single-stage second frequency pass circuit, and wherein the first frequency is different to the second frequency. In this manner, the multi-stage Wilkinson power combiner creates at least a split of 1:4 (or higher) to accommodate at least four or more transceiver beamformer channels, for example in a single integrated circuit (IC), for example to drive four or more patches on say an antenna array. In some examples, it is envisaged that one stage of the multiple stages may be a high-pass operating at a different centre frequency than a second stage that operates at a different centre frequency due to being a low-pass stage.

In some examples, the Wilkinson Power combiner may use a combination of single-stage high-pass and single-stage low-pass Wilkinson combiners, in either configuration, e.g. HP-LP or LP-HP. In some examples, a band-pass stage may be constructed using combined high-pass and low-pass stages, dependent upon the configured centre frequencies of the respective HP and LP stages. Thus, in some examples, the at least two power combining stages of the Wilkinson power combiner may be configured as a 2-stage band-pass, BP, frequency circuit based on a first centre frequency of the single-stage first HP frequency pass circuit and a second centre frequency of the single-stage second LP frequency pass circuit, thereby forming a BP response.

In some examples, a high-pass (or band-pass stages with a HP stage and LP stage) of a Wilkinson Power combiner may be configured to include a port-to-port series or parallel RL isolation circuit that is implemented by a compact low Q-factor inductor in lower metal layers. In some examples, a FIG. 8-shaped inductor may be employed in the design, as the layout implementation of the low-pass Wilkinson Power combiner for millimeter-wave applications. In this manner, in some examples, the multi-stage Wilkinson power combiner may yield the best trade-off between insertion loss and isolation bandwidth within a compact design. In some examples, a series RC isolation circuit may be used for a low-pass Wilkinson Power combiner stage. In this manner, in some examples, the multi-stage Wilkinson power combiner may improve the frequency bandwidth of isolation.

In a second aspect of the invention, examples of the present invention provide a Wilkinson power combiner that includes at least one high-pass, HP, frequency circuit. The HP frequency circuit includes at least one of: (i) one input port coupled to at least two output ports via at least two paths; and an input shunt inductor coupling the input port to ground: and coupled to the at least two output ports via respective series capacitances on the at least two paths, which in cooperation with the input shunt inductor forms a first HP frequency circuit; (ii) at least one resistor-inductor, R-L isolation circuit configured to couple the at least two output ports that forms a second HP frequency circuit. In this manner, a more compact Wilkinson power combiner can be designed. Furthermore, in this manner, a high-pass circuit may be implemented in a very compact structure, since the isolation network with its low-Q inductor can be implemented, say, underneath in a lower metal to save die area. The high-pass circuit also enables a shunt inductor at the input that can also serve as ESD element. Furthermore, in a cascading high-pass and low-pass network implementation, it is possible to make wide band-pass characteristics with high selectivity at both sides of the pass-band.

Figure 2:
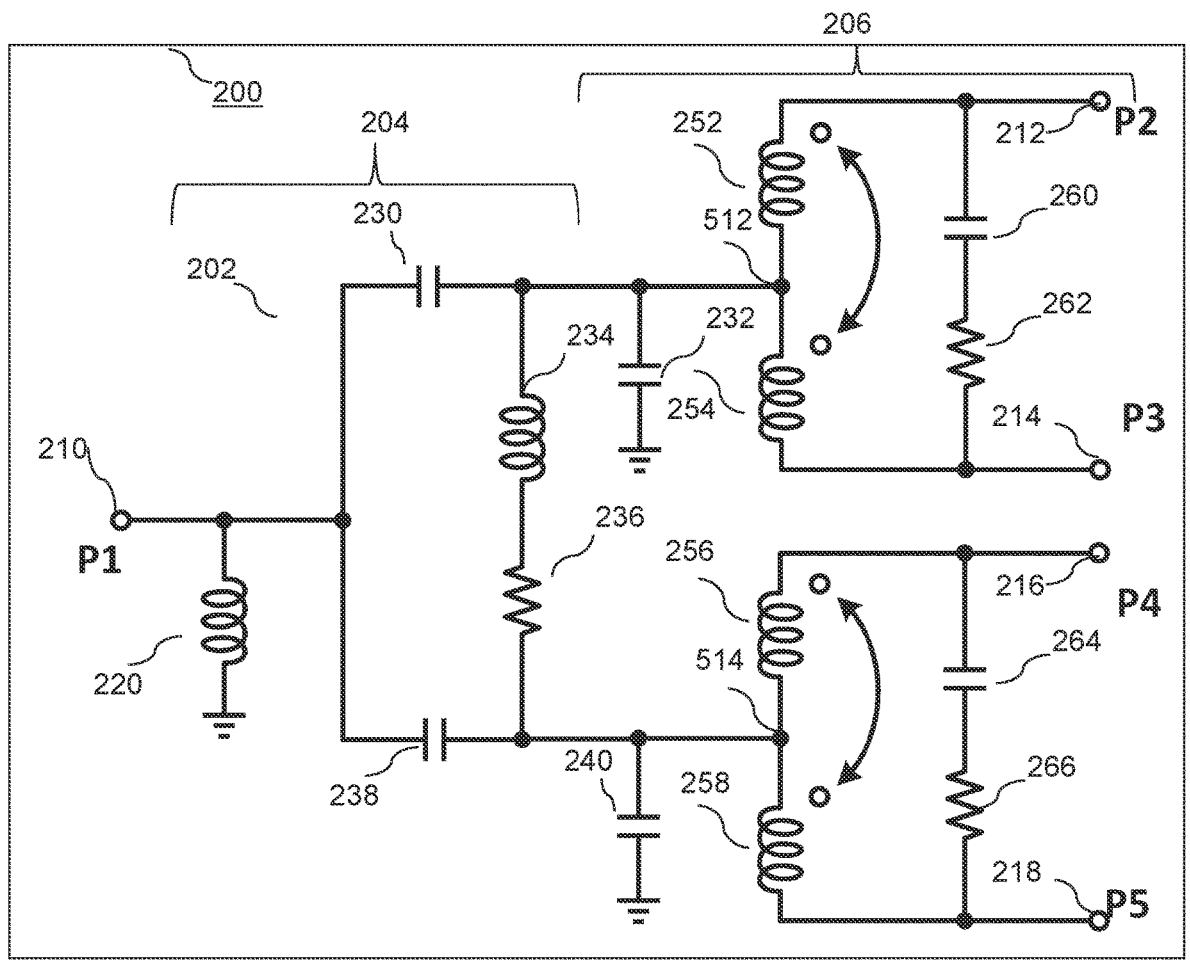
FIG. 2 illustrates a communication unit with an (at least) 2-stage Wilkinson power combiner design, adapted according to example embodiments of the invention.

Referring first to FIG. 2, a communication unit 200 with an (at least) 2-stage Wilkinson power combiner 202 design is illustrated, according to example embodiments of the invention. The communication unit 200 comprises a receiver and a transmitter, each comprising distinct circuits and signal paths, and each coupled to an antenna or array of antennas (not shown). The receiver and a transmitter of the communication unit 200 are each connected to the antenna or array of antennas by an (at least) 2-stage Wilkinson power combiner 202, which may be configured to isolate signals between the transmitter and receiver circuits.

Although this example illustrates a 2-stage Wilkinson power combiner/splitter design, i.e. a first power combining stage 204 with a second power combining stage 206, and consequently a 1-to-4 input/output design, it is envisaged that in other examples, as will be appreciated by a skilled artisan, the concepts described herein apply equally to more stages, e.g. a 3-stage, i.e. a 1-to-8 input/output design; a 4-stage, i.e. a 1-to-16 input/output design, or extensions or variations thereof, etc. In this example, the 2-stage 204, 206 Wilkinson power combiner 202 includes a first high-pass (filtering) Wilkinson power combiner/splitter stage and a second stage with two second low-pass (filtering) Wilkinson power combiner/splitter circuits. It is envisaged that in other examples, as will be appreciated by a skilled artisan, the concepts described herein apply equally to a different configuration of stages, e.g. a HP-Wilkinson power combiner/splitter stage followed by one or two or more further HP Wilkinson power combiner/splitter stages, a LP-Wilkinson power combiner/splitter stage, followed by one or two or more further HP Wilkinson power combiner/splitter stages, etc. In some examples, it is envisaged that one stage of the multiple stages may be a high-pass operating at a different centre frequency than a second stage that operates at a different centre frequency due to being a low-pass stage. Hereafter, a reference to high-pass stage is intended to also cover HP and LP stages that are combined to form a band-pass design.

The 2-stage Wilkinson power combiner 202 includes a first input/output port (P1) 210, with four (opposite) output/input ports, respectively P2 212, P3 214, P4 216, P5 218, dependent upon the combining or splitting application. The first input/output port (P1) 210 is coupled to an input shunt inductor 220, which is configured to provide input electrostatic discharge, protection. With a 2-stage RF Wilkinson combiner 200, with HP and LP stages, the insertion loss and isolation between the first input/output port (P1) 210, and the four (opposite) output/input ports, respectively P2 212, P3 214, P4 216, P5 218, provides a wideband response through a combination of HP and LP circuits.

In this example, the first power combining stage 204 is configured as a high-pass (HP) circuit and includes two signal paths coupled to the single port P1 210 that includes series capacitors 230, 238. Unlike the known Wilkinson power combiner that uses a low-pass combiner with series R-C isolation circuit at the input port, examples of the present invention include the shunt inductor 220 for a dual purpose of functioning as an ESD coil as well as part of a HP circuit that includes series capacitors 230, 238.

In this example, the first high-pass power combining stage 204 comprises shunt inductor 220 as well as a series-coupled lumped element inductor/coil 234 and isolation resistance $R_{iso}$ 236 that separates (and isolates) receive or transmit signals on the two paths.

In this 2-stage example, the second power combining stage 206 is configured as two parallel low-pass circuits, with each of the two signal paths being split into two further signal paths such that the first power combining stage 204 is coupled to four input/output ports, respectively P2 212, P3 214, P4 216, P5 218, via series capacitors 230, 233 connected to the second power combining stage 206 from the first power combining stage 204, The second power combining stage 206 (which in this example forms two second stage low-pass Wilkinson combiners) couples the first high-pass power combining stage 204 to the four input/output ports of the two parallel low-pass circuits, respectively P2 212, P3 214, P4 216, P5 218 includes, at each input, respective shunt capacitors 232, 240, connected to each respective path via series-coupled lumped element inductors/coils 252 and 254, 256 and 258. The values are given by equations [2].

In some examples of the invention, within the pairs of series-coupled lumped element inductors/coils 252, 254 and series-coupled lumped element inductors/coils 256, 258, leading to the two parallel low-pass circuits, the paired inductors/coils 252, 254 and/or paired inductors/coils 256, 258 may form mutually coupled inductors. In some examples, coupling the inductors may save die area, for example by ensuring that there is zero mutual coupling between the inductor pairs and arranging to inter-wind those inductor pairs, for example using a figure-8 shaped inductor layout, as described in FIG. 9. Additionally, with such a zero mutual coupling configuration and inductor/coil layout, it is possible to organize a layout that is able to reach, say, all the analog beamforming channels of a communication unit that employed multiple beamforming channels in an efficient manner.

In this example, each of the two parallel low-pass circuits comprises a respective series isolation resistance $R_{iso}$/capacitance (R-C) circuit 260, 262 and 264, 266, which separates (and isolates) receive or transmit signals on the respective two paths of each of the two parallel low-pass circuits.

In this example, and compared to a classical parallel isolation RC circuit, the LP circuits in FIG. 2 illustrate a series isolation RC circuit. This proposal increases the isolation frequency bandwidth. Here, the LP circuit component parameters are:

$$L_{in} = \frac{Z_0}{\omega(1-k)} \quad [2]$$

$$C_{in} = \frac{1}{\omega Z_0}$$

$$C_{iso} = \frac{1+k^2}{\omega Z_0(1-k^2)}$$

$$R_{iso} = \frac{(1+k)^2}{1+k^2} Z_0$$

In an example whereby the communication unit 200 uses, say, a beamformer that is able to communicate on a plurality of communication channels, it is envisaged that the at east 2-stage Wilkinson power combiner design may be able to provide channel-to-channel isolation. Here, the channel-to-channel isolation is implemented in both stages of the Wilkinson power combiner by the shunt circuits (series R-L or R-C in FIG. 2). In this HP-LP example, the combination of high-pass and low-pass circuits may be configured to create an overall wide band-pass performance. In a beamformer application, isolation between each channel in the beamformer (carrying the same modulation) needs to be carefully aligned using the phase shifters in each channel, so as to guarantee good coherent signal reception and transmission. This addresses a known problem with beamformer applications, in that poor isolation can cause inter-channel interference, thereby degrading the coherency of the total beamforming signal that is transmitted or received.

Thus, examples of the invention according to a first aspect describe a Wilkinson power combiner 202 that includes at least one input port 210 coupled to at least one output port 212, 214, 216, 218 by at least two power combining stages. A first power combining stage 204 is configured as a single-stage first frequency pass circuit and a second power combining stage 206 is configured as a single-stage second frequency pass circuit. In accordance with examples of the invention, whereby the first frequency is different to the second frequency.

In some examples, it is envisaged that the at least two power combining stages may include an optimized isolation circuit to provide for a wider isolation bandwidth, for example by tuning isolation inductor Liso 234, isolation resistor Riso 236, isolation capacitors Ciso 250, 264 and isolation resistors Riso 262, 266 to further improve isolation bandwidth. In a typical example for centering the operational frequency stages of a high-pass and low-pass example Wilkinson combiner, where the input and output impedances are $Z_0$, the device parameters may be as shown in the following equations:

$$L_{220} = \frac{Z_0}{\omega}$$

$$C_{230,238} = \frac{1}{\omega Z_0}$$

$$L_{234} = \frac{Z_0}{\omega}$$

$$R_{236} = Z_0$$

$$C_{232,240} = \frac{1}{\omega Z_0}$$

$$L_{252,254,256,258} = \frac{Z_0}{\omega(1-k)}$$

$$C_{260,264} = \frac{1+k^2}{\omega Z_0(1-k^2)}$$

$$R_{262,266} = \frac{(1+k)^2}{1+k^2} Z_0$$

Figure 12:
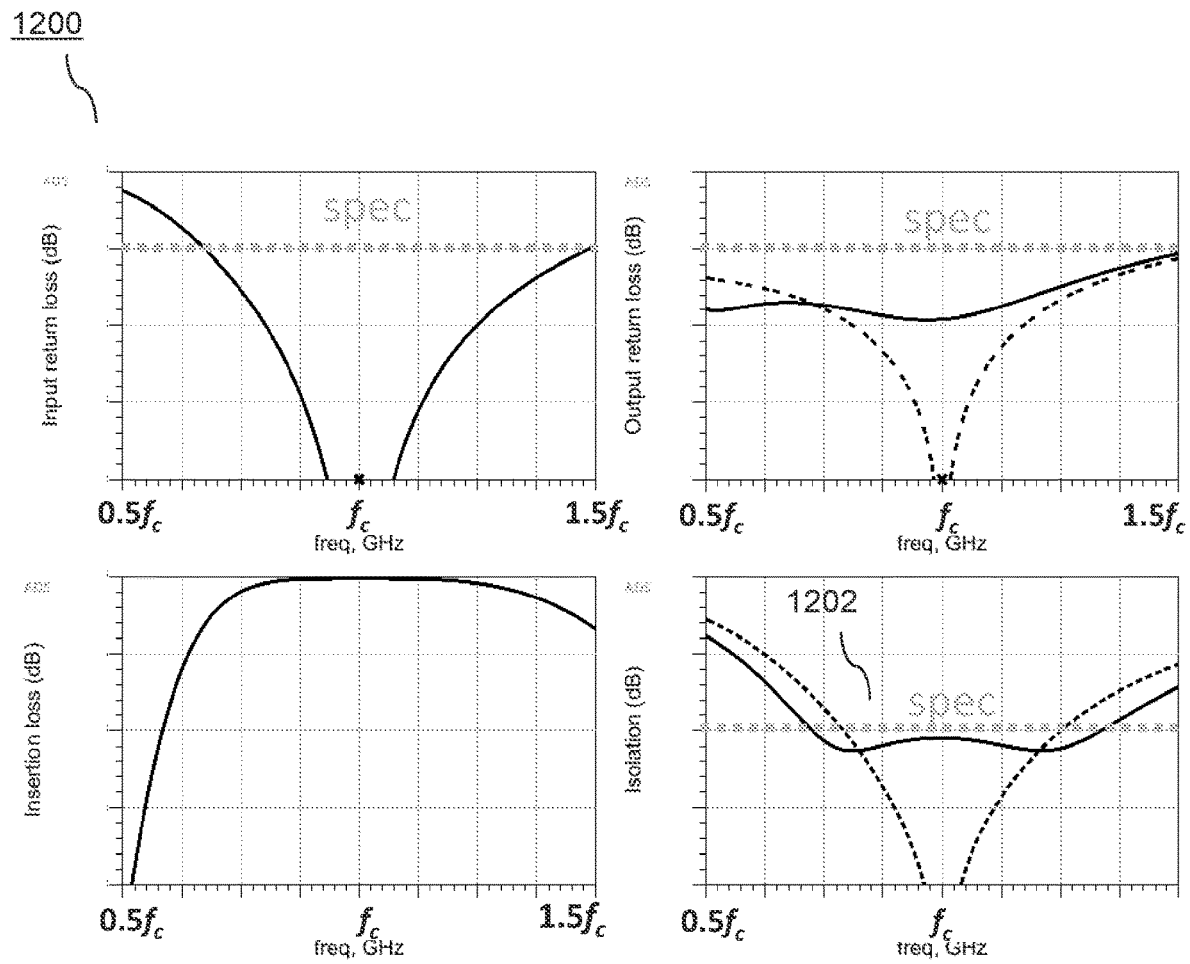
FIG. 12 illustrates one example of a performance comparison of the (at least) 2-stage Wilkinson power combiner design of FIG. 2, and an isolation network tuned case that improves the isolation bandwidth, according to example embodiments of the invention.

In order to improve the isolation bandwidth, examples of the invention may tune some of the components, for example decreasing inductor, $L_{234}$ to shift up the isolation frequency and increasing isolation capacitors Ciso 260, 264 to shift down the isolation frequency. In combination, this results in a wider isolation bandwidth. The plots 1200 illustrated in FIG. 12 provide this performance comparison, with the dotted lines referring to the original case (both low-pass and high-pass Wilkinson combiner stages are centered at fc), and the solid lines refer to the isolation network tuning case that improves the isolation bandwidth in 1202.

In some optional examples, one of the single-stage first frequency pass circuit and single-stage second frequency pass circuit is configured as a high-pass, HP, frequency circuit. In this manner, the HP frequency circuit, with a dual-function shunt inductor at the input (that serves as part of the HP circuit as well as ESD element) may be implemented as a very compact structure. The compact structure can be achieved as the isolation circuit with its low-Q inductor can be implemented underneath in lower metal to save area. Furthermore, in some examples, cascading multiple high-pass networks enables to make higher order filters to tailor specific pass and stop-band characteristics (e.g. Chebyshev, Butterworth). For example, an amplifier circuit usually benefits from having a wide-band loading that is flat across the pass-band, which can be enabled e.g. by having cascade of LP and HP circuits. Furthermore, in some optional examples, it is envisaged that different frequencies in the cascaded stages maybe exploited, for example to create specific filter characteristics, such as Chebyshev, Butterworth, etc.

In some optional examples, the HP frequency circuit includes the at least one input port 210 coupled to the at least two power combining stages via respective series capacitances 230, 238 and coupled to ground via an input shunt coil 220.

Figure 5:
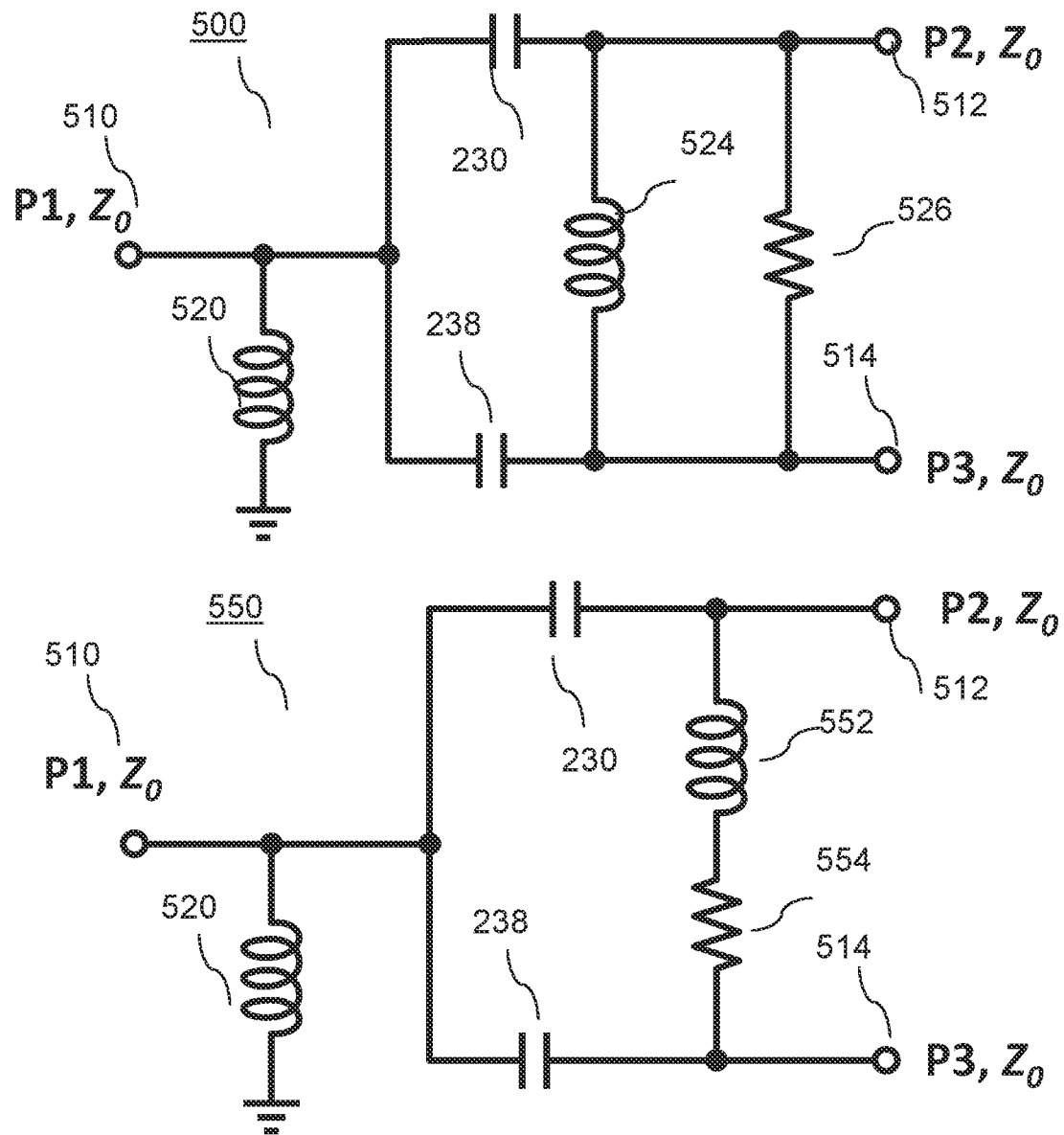
FIG. 5 illustrates two optional example implementations for a RF high pass (HP) stage of, say, a 2-stage power RF Wilkinson combiner/splitter of FIG. 2, according to example embodiments of the invention.

In some optional examples, the shunt coil 220 is configured to function as both: (i) part of the single-stage first frequency pass circuit that sets the first frequency together with series capacitors 230, 238; and (ii) to provide electrostatic discharge, ESD, protection of the Wilkinson power combiner 202. In some optional examples, the HP frequency circuit comprises a series R-L isolation circuit between two intermediate input-output ports 512, 514 coupled between the at least one input port 210 and the at least one output port 212, 214, 216, 218. In some optional examples, the HP frequency circuit comprises a parallel R-L isolation circuit between the two intermediate output ports 512, 514 coupled between the at least one input port 210 and the at least one output port 212, 214, 216, 218, as shown in FIG. 5. In some optional examples, the inductor 234 in the RL isolation circuit may be a slopey inductor configured in a lower metal layer with a non-high Q'. In some examples, the isolation resistor 236 may be embedded as the parasitic resistor of the inductor 234, which makes it a low-Q inductor, sometimes referred to as a 'slopey' inductor. In this manner, the isolation resistor 236 embedded as a parasitic resistor of the inductor 234 can be implemented within a relatively small area and in lower metal layer, thereby hidden underneath the rest of the structure comprising the high-Q elements, such as series capacitors 230, 238.

Figure 8:
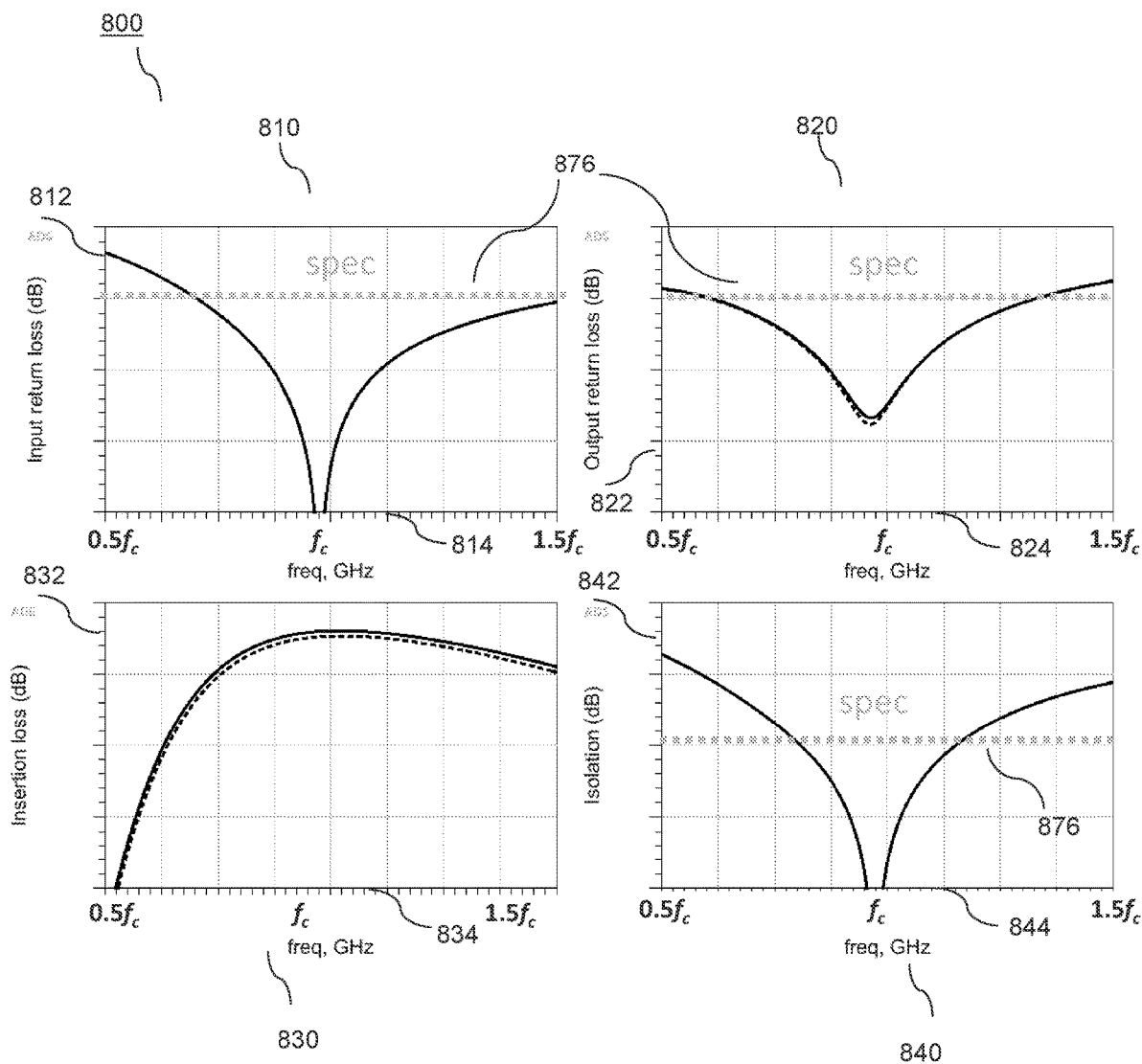
FIG. 8 illustrates one example of a performance of the layout implementation in FIG. 7, according to example embodiments of the invention.

In some optional examples, the first power combining stage 204 may be coupled to the second power combining stage 206 via at least two zero mutually-coupled inductors 252, 254 and/or 256, 258 configured in a figure-8 arrangement. In some optional examples, the single-stage second frequency pass circuit is configured as a low-pass, LP, frequency circuit. In some optional examples, the Wilkinson power combiner 202 may be configured as a 2-stage one input port 210, four output port 212, 214, 216, 218 design.

Clearly, the various components within the wireless communication unit 200 can be realized in discrete or integrated component form, with an ultimate structure therefore being an application-specific or design selection.

Figure 3:
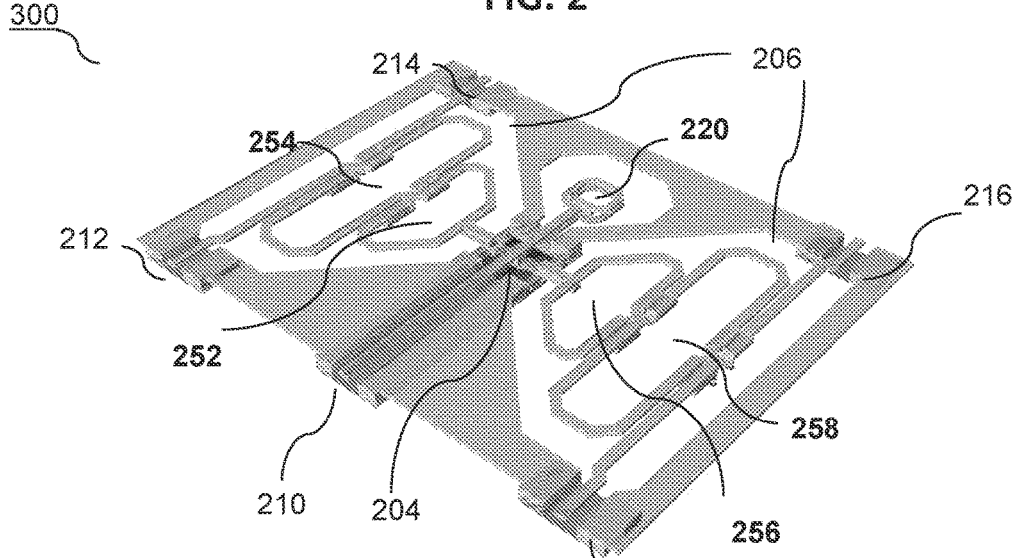
FIG. 3 illustrates one example of a layout of a 2-stage power RF Wilkinson combiner design of FIG. 2, according to example embodiments of the invention.

Referring now to FIG. 3, FIG. 3 illustrates one example of a layout 300 of the 2-stage power RF Wilkinson combiner/splitter design of FIG. 2 showing five input/output ports, according to example embodiments of the invention. The 2-stage RF Wilkinson combiner 200 includes the first input/output port (P1) 210, with four (opposite) output/input ports, respectively P2 212, P3 214, P4 216, P5 218. The 2-stage RF Wilkinson combiner 200 includes a first high-pass (HP stage) 310 connected to the first input/output port (P1) 210. As shown, P2 212, P3 214 provide inputs/outputs after a space consuming low-pass (LP) stage on the left-hand side of the layout 300. Similarly, P4 216, P5 218 provide inputs/outputs after a further space consuming low-pass (LP) stage on the left-hand side of the layout 300.

The example layout 300 of FIG. 3 further illustrates other circuit components of FIG. 2, including the shunt inductor 220, the area of a first-stage high-pass Wilkinson combiner 204 and the area of a second stage low-pass Wilkinson combiner 206. FIG. 3 also illustrates coils referring to the series inductors 252, 254 and 256, 258 in FIG. 2, formed as figure-8-shape inductors, which are similar to the figure-8-shape inductors of the FIG. 9 example.

In the layout 300 of FIG. 3, there are two figure-8 shape inductors 315 as the second-stage Wilkinson in the layout left side and right side. The figure-8 shape inductors 315 are able to localize the magnetic field and reduce the inductive cross-talk to other inductors. In addition, using the figure-8 shape inductors 315 for the second stage Wilkinson power combiner layout, it is also possible to improve the channel-to-channel isolation between left side ports (P2 212 & P3 214) and right side ports (P4 216 & P5 218).

In this example, FIG. 3 refers to an optimized layout for a 39-GHz application. The values for a 39-GHz application can be determined from equation [4]. Port impedance is usually set to 50 Ohm as default. Thus, for a typical 39-GHz case: shunt inductor 220 L=204 pH, series capacitances C 230, 238=82 fF, isolation inductor 234 L=204 pH, isolation resistor 236 R=50 Ohm. For a typical 28-GHz case, again determined from equation [4]: shunt inductor 220 L=284 pH, series capacitances C 230, 238=114 fF, isolation inductor 234 L=284 pH, isolation resistor 236 R=50 Ohm. Such values enable the shunt inductor 220 L to be part of the HP circuit as well as perform the additional ESD function.

Figure 4:
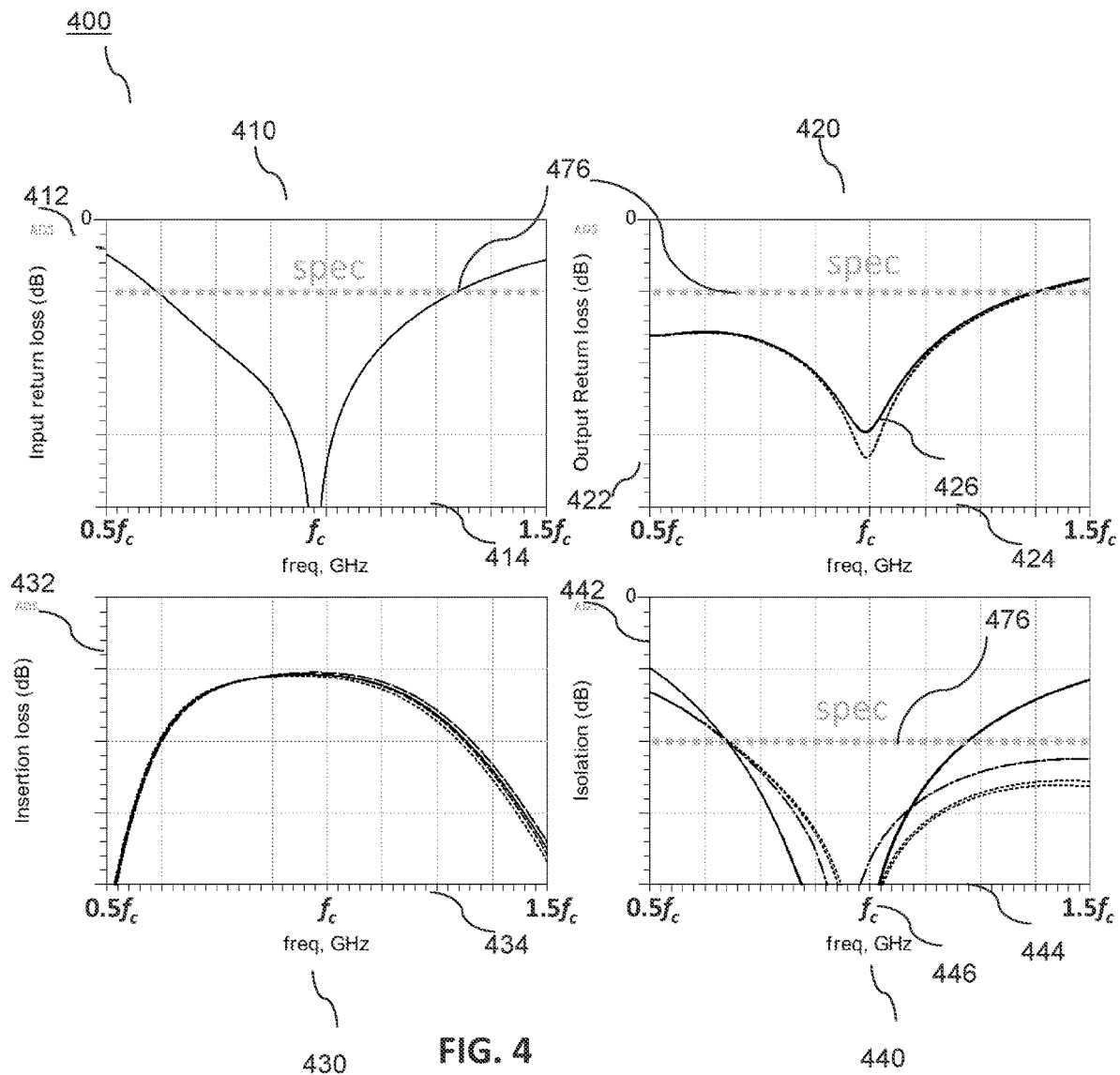
FIG. 4 illustrates one example of a number of graphs showing a simulated performance of the 2-stage power RF Wilkinson combiner design of FIG. 2, according to example embodiments of the invention.

Referring now to FIG. 4, FIG. 4 illustrates one example of a number of graphs 400 showing a performance of the 2-stage Wilkinson power combiner design of FIG. 2, according to example embodiments of the invention. A first graph 410 illustrates input return loss 412 vs. frequency 414 vis-a-vis a target performance specification 476. A second graph 420 illustrates output return loss 422 vs, frequency 424 vis-a-vis a target performance specification 476, A third graph 430 illustrates insertion loss 432 vs, frequency 434. A fourth graph 440 illustrates isolation 442 vs. frequency 444 vis-a-vis a target performance specification 476. The graphs 400 illustrate the Wilkinson power combiner with a parallel isolation RC circuit (dotted line) and series isolation RC circuit (solid line). When comparing the fourth graph 440 of isolation vs second graph 420 of output return loss, it is noteworthy that with regard to isolation between channels, for example in an analog beamformer application as illustrated in FIG. 1, it is important to keep the signal coherency after re-combining the individual paths, Therefore, in accordance with some examples, the slightly worse return loss is acceptable or may be compensated for by the preceding circuit, e.g. the first combining stage 204 of FIG. 2.

As illustrated in fourth graph 440 the series isolation RC circuit increases the frequency bandwidth of isolation 446 with a trade-off of narrower frequency bandwidth 426 of output return loss (as illustrated in the second graph 420. In some example applications, for example one that employs beamforming, the channel-to-channel isolation is achieved mainly by the 1-to-2 port configuration of a Wilkinson combiner/splitter.

Referring now to FIG. 5, FIG. 5 illustrates two optional example implementations for a RF high pass (HP) frequency circuit of a RF Wilkinson power combiner, for example the Wilkinson power combiner of FIG. 2, according to example embodiments of the invention. In this example, the Wilkinson power combiner includes, on one side, a single port P1 510 with a shunt inductor 520 to provide a matched impedance Zo, and, on the other side two ports P2 512, P3 514. In this example, the high-pass (HP) circuit 500 includes two signal paths coupled to the single port P1 510 that includes series capacitors 230, 238. The shunt inductor 520 located at the input (or output, dependent upon the function) is a basic part of the HP circuit 500 that includes these series capacitors 230, 238 to form a first HP frequency circuit. Advantageously, in accordance with examples of the invention, shunt inductor 520 may also perform the function of an ESD protection element. The HP circuit 500 also includes a parallel-coupled lumped element inductor/coil 524 and isolation resistance. $R_{iso}$ 526 that separates (and isolates) receive or transmit signals on the two paths to form a second HP frequency circuit.

The HP circuit 500 component parameters are:

$$L_{in} = \frac{Z_0}{\omega} \qquad [3]$$

$$C_{in} = \frac{1}{\omega Z_0}$$

$$L_{iso} = \frac{2Z_0}{\omega}$$

$$R_{iso} = 2Z_0$$

Compared to low-pass Wilkinson splitter, the high-pass circuit 500 includes the shunt inductor 520 coupling ground to the input port, which naturally absorbs the ESD protection functionality. Thus, and advantageously the high-pass circuit 500 design is more compact compared to a classical low-pass Wilkinson combiner/splitter plus extra ESD protection circuit, as this classical configuration includes a series (bulky) coil in each path of a CLC low pass Ti network.

In some examples, the shunt inductor 520 can serve as an ESD coil due to its ability to sink current to ground after an ESD event. The existing art of a low-pass Wilkinson splitter circuit does not have this component naturally, and thus an additional ESD element is required in known implementations. In examples of the invention, a high-pass circuit is formed with a shunt-L and series-C component, since both present a zero-transmission at zero frequency. At an infinite frequency, the signal is passed with zero attenuation, as the shunt-L presents an infinite impedance, and a series-C presents zero impedance.

In another example, the Wilkinson power combiner includes, on one side, a single port P1 510 with a shunt inductor 520 to provide a matched impedance Zo, and, on the other side two ports P2 512, P3 514. In this second example, the high-pass (HP) circuit 550 includes two signal paths coupled to the single port P1 510 that includes series capacitors 230, 238. Advantageously, and again in accordance with examples of the invention, the shunt inductor 520 functions as part of a first HP circuit and additionally adopts a purpose of an ESD protection element. The HP circuit 550 also includes a series-coupled lumped element inductor/coil 552 and isolation resistance $R_{iso}$ 554 that separates (and isolates) receive or transmit signals on the two paths.

The second high-pass circuit 550 of FIG. 5 comprises component parameters of:

$$L_{in} = \frac{Z_0}{\omega} \quad [4]$$

$$C_{in} = \frac{1}{\omega Z_0}$$

$$L_{iso} = \frac{Z_0}{\omega}$$

$$R_{iso} = Z_0$$

Figure 7:
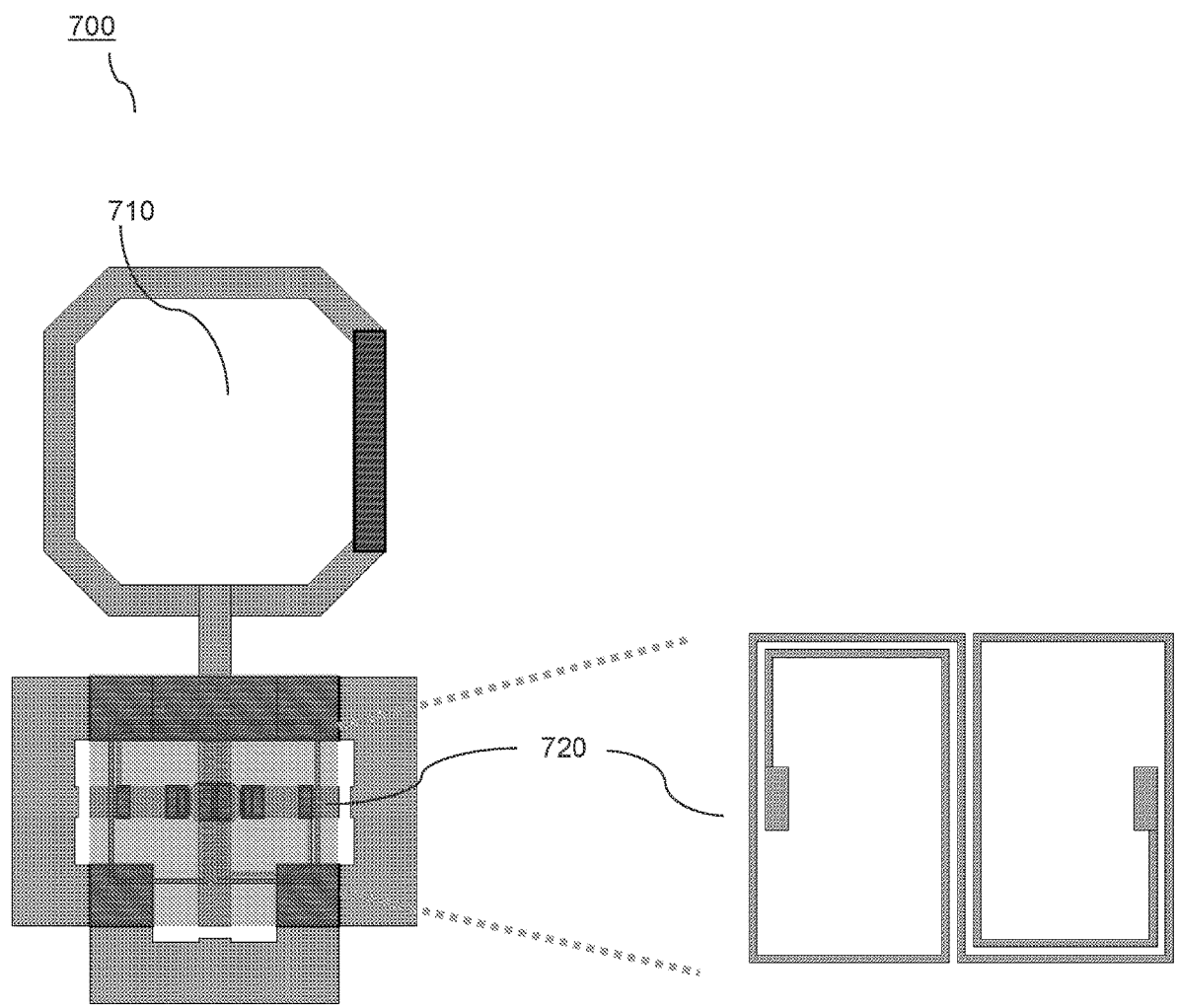
FIG. 7 illustrates one example of a layout of the RF HP stage of FIG. 5, according to example embodiments of the invention.

It is noteworthy that, $$\frac{\omega L_{iso}}{R_{iso}} = 1,$$

as the means that the Q of the inductor, Q=Imag(Z)/real(Z), can be '1', and thus can be implemented with a less-accurate inductor. In some examples, the isolation resistance $R_{iso}$ 554 may be embedded inside the inductor (as illustrated in the layout of FIG. 7), thereby allowing the inductor to be of a low-Q by design.

In this manner, in one example layout of FIG. 5, it is possible to use lower metal layer to make a very compact input shunt coil enables ESD protection function, and the port-to-port low Q isolation coil makes the design very compact.

Thus, in a second aspect of the invention, two HP frequency circuits 500, 550 are described that include at least one input port 510 coupled to at least two output ports 512, 514 via at least two paths. Furthermore, the HP frequency circuits 500, 550 include at least one of: an input shunt coil 520 that couples the input port 510 to ground; wherein the one input port 510 is coupled to the at least two output ports 512, 514 via respective series capacitances 230, 238, which in cooperation with the input shunt coil 520 forms a first HP frequency circuit; and at least one resistor 554, 526—inductor 552, 524, R-L isolation circuit configured to couple the at least two output ports 512, 514 that forms a second HP frequency circuit.

In the illustrated examples, the second HP frequency circuit includes either a parallel isolation RL HP circuit 500 or a series shunt isolation RL HP circuit 550. In some examples, the HP frequency circuit may be of, say, a 2-stage RF Wilkinson power combiner/splitter, such as the 2-stage RF Wilkinson power combiner of FIG. 2.

Figure 6:
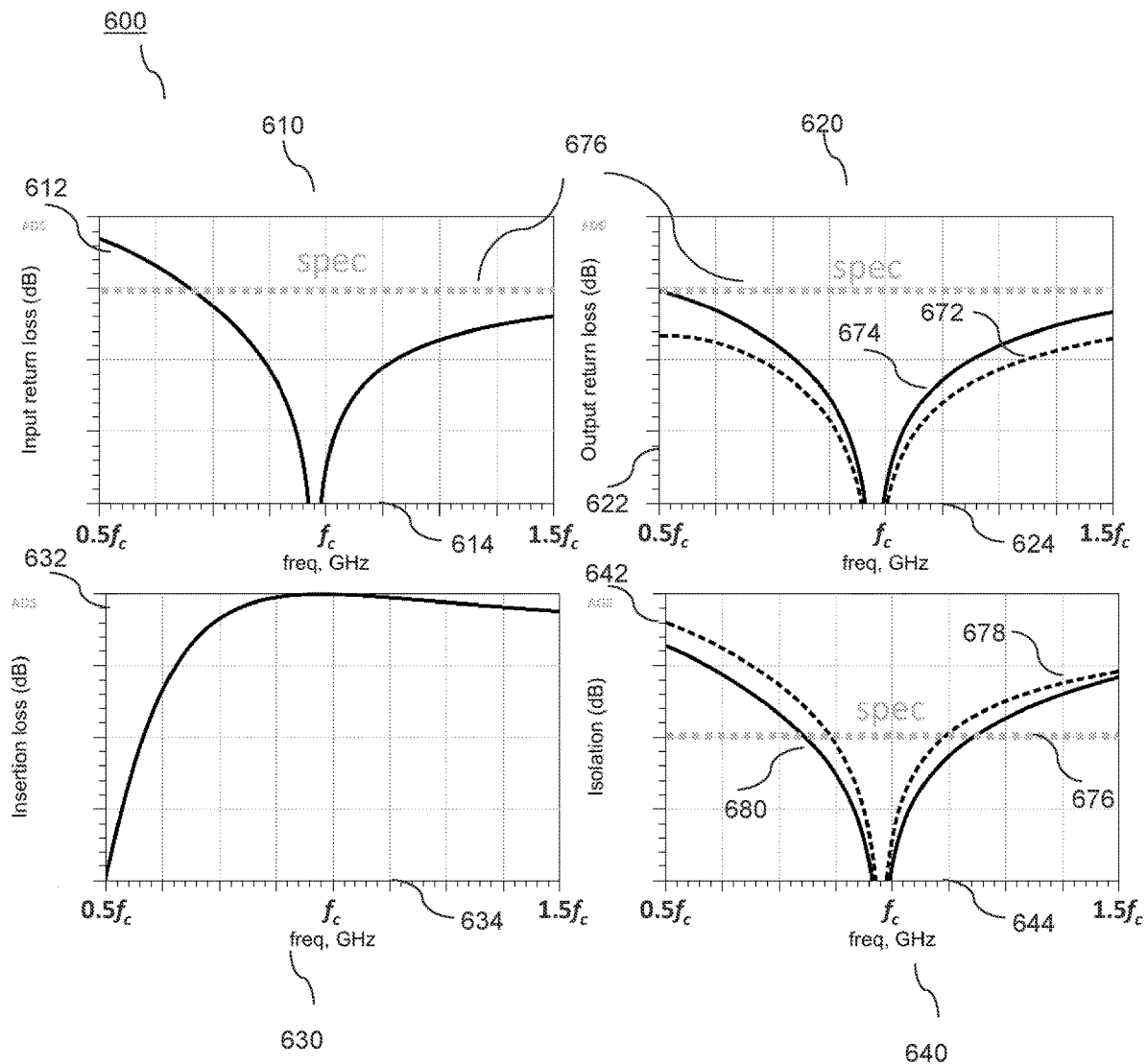
FIG. 6 illustrates one example of a number of graphs showing a simulated performance of the example HP circuits of FIG. 5, according to example embodiments of the invention.

Referring now to FIG. 6, FIG. 6 illustrates a number of graphs showing a simulated performance of comparing performance differences between series RL isolation circuit 550 and a parallel RL isolation circuit 500 of FIG. 5, e.g. for a HP circuit, according to example embodiments of the invention. A first graph 610 illustrates input return loss 612 vs. frequency 614 for both the parallel and series isolation R-L circuits 500, 550 vis-à-vis a target performance specification 676. A second graph 620 illustrates output return loss 622 vs. frequency 624 for both the parallel and series isolation R-L circuits 500, 550 vis-à-vis a target performance specification 676. A third graph 630 illustrates insertion loss 632 vs. frequency 634 for both the parallel and series isolation R-L circuits 500, 550. A fourth graph 640 illustrates isolation 642 vs. frequency 644 vis-à-vis a target performance specification 676 for both the parallel and series isolation R-L circuits 500, 550. It is noted that both the parallel and series isolation R-L circuits 500, 550 can be implemented with a low-Q inductor. Here, the dotted lines 672 and 678 showing the parallel isolation RL HP circuit 500 and the solid lines 674 and 680 showing the series isolation RL HP circuit 550 versus a target performance specification 676. In this case, the series RL isolation network may use a less-accurate coil that can improve the isolation bandwidth to the more acceptable detriment that it sacrifices a small performance in output return loss.

Referring now to FIG. 7, FIG. 7 illustrates one example of a layout 700 of the HP circuit of FIG. 5, according to example embodiments of the invention. In this example illustration, a HR Wilkinson combiner. The high-Q shunt matching coil/inductor 710, which also serves as ESD component 520 in FIG. 5), may be implemented in the metal layer M6. Furthermore, since the input (or output) port-to-port isolation coil of FIG. 5, e.g. inductor 524, 552 needs a low Q-factor of 1, this (slopey) coil may be implemented underneath the main structure in an M1 layer 720, as shown in FIG. 7, which advantageously leads to more compact area. Also, in this layout example the series isolation RL circuit realized by the slopey coil has a wider isolation bandwidth than the parallel RL isolation circuit.

Referring now to FIG. 8, FIG. 8 illustrates one example of a simulated performance of the layout implementation of FIG. 7. according to example embodiments of the invention, A first graph 810 illustrates input return loss 812 vs. frequency 814 for both the parallel and series isolation R-L circuits 500, 550 vis-à-vis a target performance specification 876. A second graph 820 illustrates output return loss 822 vs. frequency 824 for both the parallel and series isolation R-L circuits 500, 550 vis-à-vis a target performance specification 876. A third graph 830 illustrates insertion loss 832 vs. frequency 834 for both the parallel and series isolation R-L circuits 500, 550. A fourth graph 840 illustrates isolation 842 vs. frequency 844 vis-à-vis a target performance specification 876 for both the parallel and series isolation R-L circuits 500, 550. It is noted that both the parallel and series isolation R-L circuits 500, 550 can be implemented with a low-Q inductor.

Referring now to HG. 9, HG. 9 illustrates one example of a layout 900 showing a millimeter-wave Figure-8 design 920, configured to implement a pair of mutually-coupled inductors 912, 914, with close to zero inter-coupling (k≈0), according to example embodiments of the invention. In this manner, it is possible to implement a millimeter-wave figure-8 design 920, including a surrounding ground ring 930, in a compact size and which balances a trade-off between insertion loss and isolation frequency bandwidth. Advantageously, in this manner, a layout 900 in a Figure-8 configuration, can be implemented without the classical approach's need to use two individual, typically large, inductors to create the uncoupled inductor circuit.

Referring now to FIG. 10, FIG. 10 illustrates one example of a flowchart 1000 of a method of power combining/splitting using at least a 2-stage Wilkinson power combiner/splitter, according to some example embodiments of the invention. The flowchart 1000 of power combining using a Wilkinson power combiner includes coupling, at 1002, at least one input port (such as at least one input port 210 of FIG. 2) to at least one output port (such as at least one output port 212, 214, 216, 218 of FIG. 2) of the Wilkinson power combiner (such as Wilkinson power combiner 202 of FIG. 2). In one example, this coupling at 1002 uses and traverses at least two power combining stages. The flowchart 1000 further comprises configuring, at 1004, a first power combining stage (204) of the at least two power combining stages as a single-stage first frequency pass circuit. The flowchart 1000 further comprises configuring, at 1006 a second power combining stage (206) of the at least two stages as a single-stage second frequency pass circuit. The configuring at 1004 and 1006 is such that the first frequency is different to the second frequency.

Referring now to FIG. 11, FIG. 11 illustrates one example of a flowchart 1100 of a method of power combining/splitting using at least one high-pass (HP) circuit, for example in a HP-low pass (LP) arrangement, according to some example embodiments of the invention. The flowchart 1100 of power combining using a Wilkinson power combiner includes coupling, at 1102, at least one input port (such as at least one input port 510) to at least one output port (such as output ports 512, 514, 516, 518 of FIG. 2) of the Wilkinson power combiner (such as Wilkinson power combiner 202 of FIG. 2). In one example, this coupling at 1102 couples the at least one input port to the at least two output ports via at least two paths, wherein each path of the at least two paths includes a series capacitance and the input port is coupled to a shunt inductor. The flowchart 1100 further includes coupling 1104 a high-pass, HP, frequency circuit between the at least two output ports wherein the HP frequency circuit comprises at least one resistor-inductor, R-L, isolation circuit.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

In some examples, the circuits may be implemented using discrete components and circuits, whereas in other examples the circuit may be formed in integrated form in an integrated circuit for example using quarter wave ($\lambda/4$) transmission lines. Because the illustrated embodiments of the present invention may, for the most part, be implemented using electronic components and circuits known to those skilled in the art, details have not been explained in any greater extent than that considered necessary as illustrated below, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals. Those skilled in the art will recognize that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, the illustrated examples may be implemented as circuitry located on a single integrated circuit or within a same device. For example, as illustrated in the Wilkinson power combiner 202 of FIG. 2. Alternatively, the circuit and/or component examples may be implemented as any number of separate integrated circuits or separate devices interconnected with each other in a suitable manner. However, other modifications, variations and alternatives are also possible. The specifications and drawings are, accordingly, to be regarded in an illustrative rather than in a restrictive sense.

In alternative embodiments, a Wilkinson power combiner (200) is described that comprises a high-pass, HP, frequency circuit (500, 550), wherein the HP frequency circuit (500, 550) comprises at least one of: (i) one input port (510) coupled to at least two output ports (512, 514) via at least two paths; and an input shunt inductor (520) coupling the input port (510) to ground; wherein the one input port (510) is coupled to the at least two output ports (512, 514) via respective series capacitances (230, 238) on the at least two paths, which in cooperation with the input shunt inductor (520) forms a first HP frequency circuit; (ii) at least one resistor (554, 526)—inductor (552, 524), R-L isolation circuit (500, 550) configured to couple the at least two output ports (512, 514) that forms a second HP frequency circuit.

In this alternative Wilkinson power combiner, the at least one R-L isolation circuit may be configured as one of: a series R-L isolation circuit (550); a parallel R-L isolation circuit (500).

In this alternative embodiment, a method (1000) of power combining using a Wilkinson power combiner (202) is also described. The method comprises: coupling (1002) at least one input port (510) to at least two output port (512, 514, 516, 518) via at least two paths wherein each path of the at least two paths comprises a series capacitance (230, 238) and the at least one input port (510) is coupled to ground via an input shunt inductor (520), which in cooperation with the series capacitance (230, 233) to form a first HP circuit; and coupling (1004) a high-pass, HP, frequency circuit (500, 550) between the at least two output ports (512, 514), wherein the HP, frequency circuit (500, 550) comprises at least one resistor (554, 526)—inductor (552, 524), R-L isolation circuit (500, 550) to form a second HP circuit.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method of power combining using a Wilkinson power combiner, the method comprising:
coupling at least one input port to at least one output port of the Wilkinson power combiner using at least two power combining stages;
configuring a first power combining stage of the at least two power combining stages as a single-stage first frequency pass circuit;
configuring a second power combining stage of the at least two stages as a single-stage second frequency pass circuit, wherein the first frequency is different to the second frequency;
configuring one of the single-stage first frequency pass circuit and single-stage second frequency pass circuit as a high-pass, HP, frequency circuit; and
coupling the at least one input port to the at least two power combining stages via respective series capacitances and coupled to ground via an input shunt inductor.

2. The method of power combining of claim 1 further comprising configuring the shunt inductor to function as both: (i) part of the single-stage first frequency pass circuit that sets the first frequency; and (ii) to provide electrostatic discharge, ESD, protection of the Wilkinson power combiner.

3. A Wilkinson power combiner comprising:
at least one input port coupled to at least one output port by at least two power combining stages,
wherein a first power combining stage of the at least two power combining stages is configured as a single-stage first frequency pass circuit and a second power combining stage of the at least two stages is configured as a single-stage second frequency pass circuit, wherein one of the single-stage first frequency pass circuit and single-stage second frequency pass circuit is configured as a high-pass, HP, frequency circuit, and the HP frequency circuit comprises the at east one input port coupled to the at least two power combining stages via respective series capacitances and coupled to ground via an input shunt inductor, and wherein the first frequency is different to the second frequency.

4. The Wilkinson power combiner of claim 1 wherein the shunt inductor is configured to function as both: (i) part of the single-stage first frequency pass circuit that sets the first frequency; and (ii) to provide electrostatic discharge, ESD, protection of the Wilkinson power combiner.

5. The Wilkinson power combiner of claim 1 wherein the HP frequency circuit comprises a series resistor-inductor, R-L isolation circuit between two intermediate input-output ports coupled between the at least one input port and the at least one output port.

6. The Wilkinson power combiner of claim 1 wherein the HP frequency circuit comprises a parallel resistor-inductor, R-L isolation circuit between two intermediate output ports coupled between the at least one input port and the at least one output port.

7. The Wilkinson power combiner of claim 5, wherein a resistor of the series R-L isolation circuit is embedded as a parasitic resistor of an inductor of the series R-L isolation circuit, configured in a lower metal layer.

8. The Wilkinson power combiner of claim 3 wherein the first power combining stage is coupled to the second power combining stage via at least two mutually-coupled inductors configured in a figure-8 arrangement to provide a zero mutual coupling.

9. The Wilkinson power combiner of claim 3 wherein the single-stage second frequency pass circuit is configured as a low-pass, LP, frequency circuit.

10. The Wilkinson power combiner of claim 9, wherein the at least two power combining stages of the Wilkinson power combiner is configured as a 2-stage band-pass, BP, frequency circuit based on a first center frequency of the single-stage first frequency pass circuit and a second center frequency of the single-stage second frequency pass circuit.

11. A communication unit comprising the Wilkinson power combiner according to claim 1.

* * * * *